United States Patent
Shimizu

[11] Patent Number: 6,107,850
[45] Date of Patent: *Aug. 22, 2000

[54] OUTPUT PULSE WIDTH CONTROL SYSTEM

[75] Inventor: Kazuyoshi Shimizu, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/904,345

[22] Filed: Jul. 31, 1997

[30] Foreign Application Priority Data

Feb. 12, 1997 [JP] Japan .................................. 9-027901

[51] Int. Cl.$^7$ .......................... H03K 3/017; H03L 7/089; H03D 3/18
[52] U.S. Cl. .......................... 327/172; 327/159; 327/176; 375/238
[58] Field of Search .................................. 327/172, 173, 327/174, 175, 176, 155, 156, 157, 158, 159; 375/238, 371, 373; 331/25

[56] References Cited

U.S. PATENT DOCUMENTS

| | | | |
|---|---|---|---|
| 4,166,985 | 9/1979 | White et al. | 372/30 |
| 4,283,785 | 8/1981 | Miyauchi et al. | 369/116 |
| 4,339,823 | 7/1982 | Predina et al. | 327/158 |
| 4,400,667 | 8/1983 | Belkin | 331/1 A |
| 4,803,384 | 2/1989 | Yamane et al. | 327/179 |
| 5,172,357 | 12/1992 | Taguchi | 331/25 |
| 5,241,567 | 8/1993 | Shimakata | 327/42 |
| 5,278,874 | 1/1994 | Liu et al. | 375/376 |
| 5,315,270 | 5/1994 | Leonowich | 331/25 |
| 5,581,214 | 12/1996 | Iga | 331/25 |
| 5,638,014 | 6/1997 | Kurita | 327/154 |
| 5,757,216 | 5/1998 | Murata | 327/156 |
| 5,847,611 | 12/1998 | Hirata | 331/1 A |
| 5,898,328 | 4/1999 | Shoji | 327/157 |

FOREIGN PATENT DOCUMENTS 2 209 443   5/1989   United Kingdom .............. H03L 7/00

*Primary Examiner*—Timothy P. Callahan
*Assistant Examiner*—Terry L. Englund
*Attorney, Agent, or Firm*—Staas & Halsey LLP

[57] ABSTRACT

A pulse width control system, to control an output pulse width on a pulse output circuit to be a predetermined value, including a first circuit outputting a pulse output signal corresponding to an input pulse, a second circuit for detecting a phase difference between an input data pulse and the pulse output signal, and a third circuit receiving the input data pulse and outputting the input pulse as a signal based on the input data pulse, wherein a pulse width of the input pulse varies based on the detected phase difference.

11 Claims, 24 Drawing Sheets

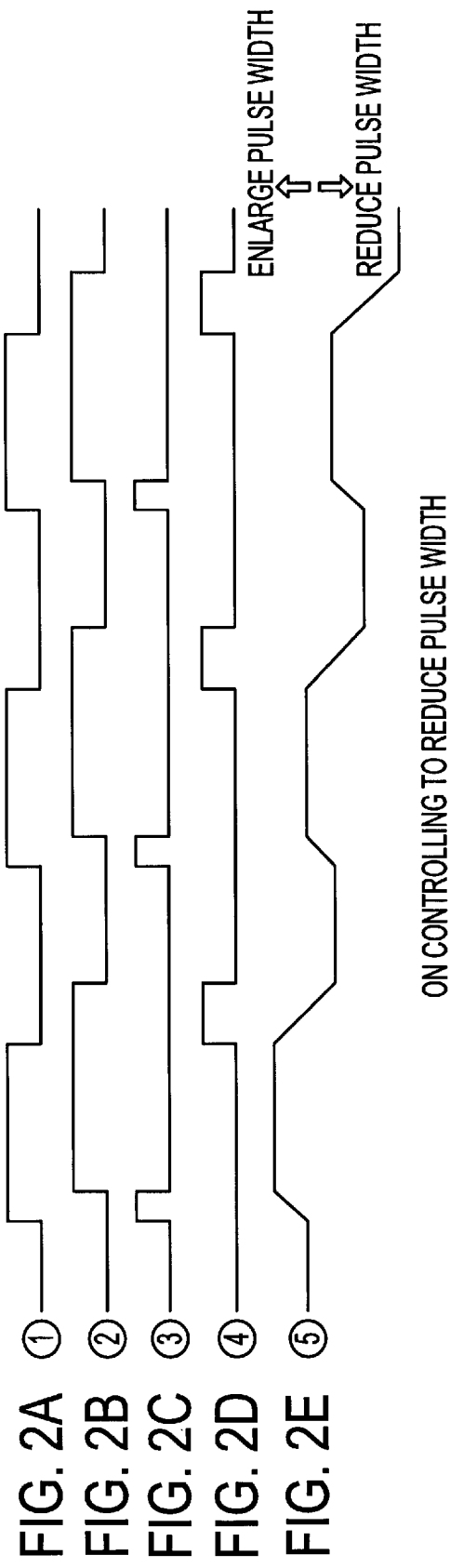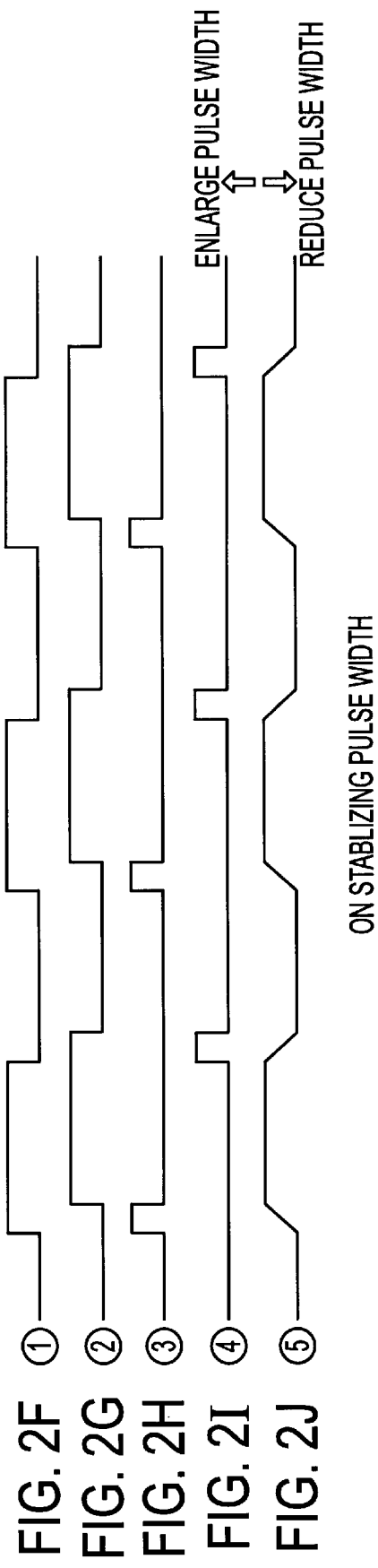

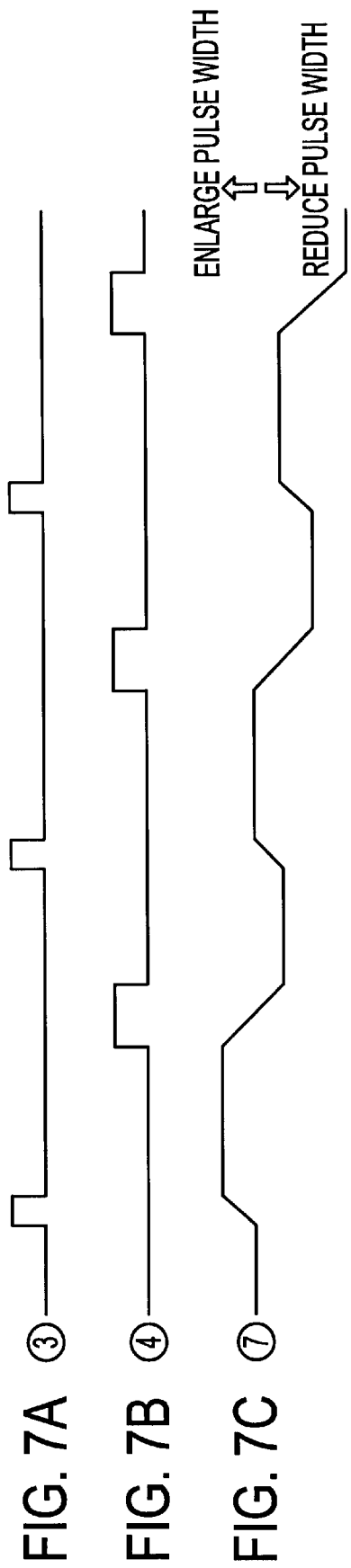

OUTPUT PULSE WIDTH CONTROL SYSTEM

BACKGROUND OF THE INVENTION

1. Field of the Invention

The present invention relates to a system which controls a pulse width of a pulse output from a pulse output circuit. More particularly, it relates to a system which can set a light-emitting pulse width of a laser diode to a required pulse width.

2. Description of the Prior Art

As various systems, in which digital signals are handled, have been widely used in recent years, an optical digital signal transmission system have been used for subscriber lines as well as primary lines. Accordingly it is necessary to realize a system for controlling a light-emitting pulse width in analogue, of a laser diode, especially, in a transmitter of a optical digital transmission system.

Increasingly, burst generated digital signals are directly processed due to a diversification of transmission systems. Therefore, it also becomes necessary to realize pulse widths control system which can control pulse width at a high speed, even when a mark to space ratio is widely varied.

Problems caused by pulse width variation generated in the beginning of a light-emitting pulse of a laser diode in a transmitter or by pulse width variation generated because of temperature and source-voltage variation will be now considered.

FIG. 22 shows characteristics of a known laser diode. A current $I_O$ indicates an output light to a driving current $I_B$. Further, a current characteristic of the output current $I_O$ to the driving current $I_B$ that a light-emission threshold current Ith is varied according to an environmental temperature. It is apparent from FIG. 22 that the current characteristic is changed to a, b and c corresponding to the change of the environmental temperatures 0° C., 25° C. and 60° C., respectively. Further, $Y_0$, $Y_{25}$, $Y_{60}$ are inclination coefficients of the current characteristics a, b, and c, respectively. As the temperature becomes higher, the inclination becomes larger.

Judging from the current characteristic of the laser diode, even if the light-emission threshold current Ith is varied according to a change of temperature, the width of an output light-emitted pulse become narrower (see $W_0$, $W_{25}$ and $W_{60}$ respectively corresponding to the temperatures 0° C., 25° C., and 60° C.), even if a level of the light-emitted output respective to a data pulse DT is kept at constant value $i_0$.

Thus, the light-emitting pulse width is varied according to the temperature. The variation of the light-emitting pulse width is caused by light-emission delay of a laser diode.

On the other hand, waveforms of an optical pulse for optical communications are prescribed in a standard of ITU-Recommendation. FIG. 23 illustrates a pattern mask of the eye diagram prescribed in the ITU-Recommendation G.662. Accordingly, it becomes necessary to control the variation of the light-emitting pulse width within a range of the eye pattern mask for optical communications.

As shown in FIG. 22, a bias current of the laser diode is controlled corresponding to the change of the temperature. That is, the bias current is changed to $I_{B0}$, $I_{B25}$ and $I_{B60}$ as the temperature becomes 0° C., 25° C. and 60° C. The bias current is set near about 80% of a threshold current.

In this way, the light-emitting pulse width becomes almost constant by controlling the bias current. However, the bias current is near the threshold current. Therefore, a dark light, called bias light-emission, is generated as noise.

Additionally, variable resistors are provided to a laser diode driving circuit in order to individually control for the beginning of the pulse variation due to the individual characteristic variation of the laser diode or the pulse variation due to source-voltage variation.

In recent years, a system for sending and receiving burst signals through an optical transmission path between a central office and a plurality of subscribers has been introduced. FIGS. 24A and 24B diagrams showing this system. Looking at FIG. 24A one station ST is connected to a star coupler COP through an optical transmission path, and further, the star coupler COP is connected to each of a plurality of subscribers 1 to n.

In this system, the station ST transmits burst signals downward and each of the subscribers transmits a response signal upward in return to the signal sent from the station ST. Distances from respective subscribers to the star coupler COP vary from each other.

Therefore, a signal level from a subscriber increase as a distance from the subscriber to the star coupler COP decreases. As described above, when the signal level increases, the bias light-emission becomes noise, and this noise is inputted to the star coupler COP.

SUMMARY OF THE INVENTION

From the view point of the above-described conventional technical status, it is an object of the present invention to provide pulse width control system which can control an output pulse width to be set a predetermined value on a pulse output circuit.

More particularly, it is an other object of the present invention to provide an optical pulse width control system in which variable resistors for controlling individual characteristic of a laser diode, and compensating temperature, electric source or voltage variation can be omitted, where the pulse output circuit is a laser driving circuit.

It is still another object of the present invention to provide an optical pulse width control system without a bias current control, which may cause a bias light-emission, where the pulse output circuit is a laser driving circuit.

BRIEF DESCRIPTION OF THE DRAWINGS

FIGS. 2A to 2J illustrate operational timing charts of the first embodiment shown in FIG. 1.

FIGS. 7A to 7C are operational timing charts of the pulse width variable voltage generator 3 shown in FIG. 6.

DESCRIPTION OF THE PREFERRED EMBODIMENTS

Figure 1:
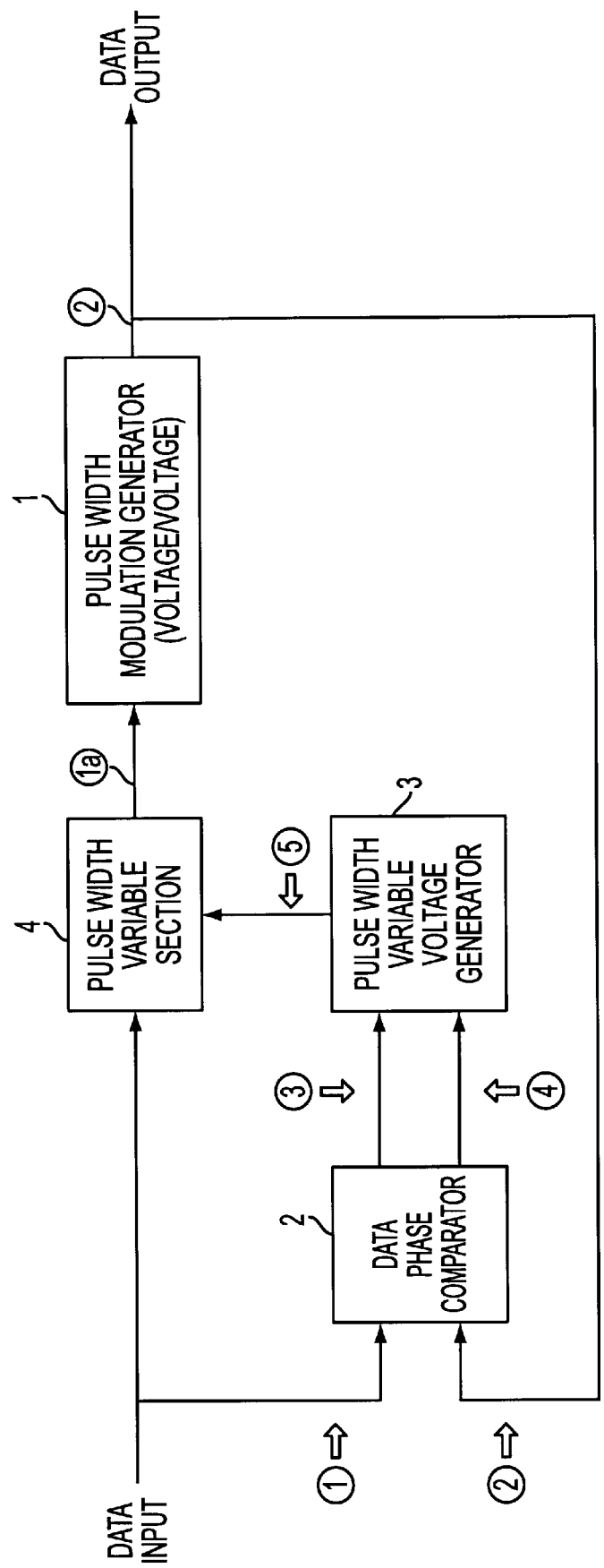
FIG. 1 is a block diagram of a first embodiment applied to pulse width control system according to the present invention.

Embodiments according to the present invention will be explained with reference to the attached drawings. Throughout the following descriptions, the same reference numerals are used to denote and identify corresponding or identical components.

FIG. 1 shows a block diagram of a laser diode driving circuit according to a first embodiment of the present invention. FIGS. 2A to 2J show waveform diagrams of parts corresponding to reference numbers shown in FIG. 1. In FIG. 1, a circuit 1, which outputs a pulse to be controlled, is an output pulse width modulation generator.

Figure 3:
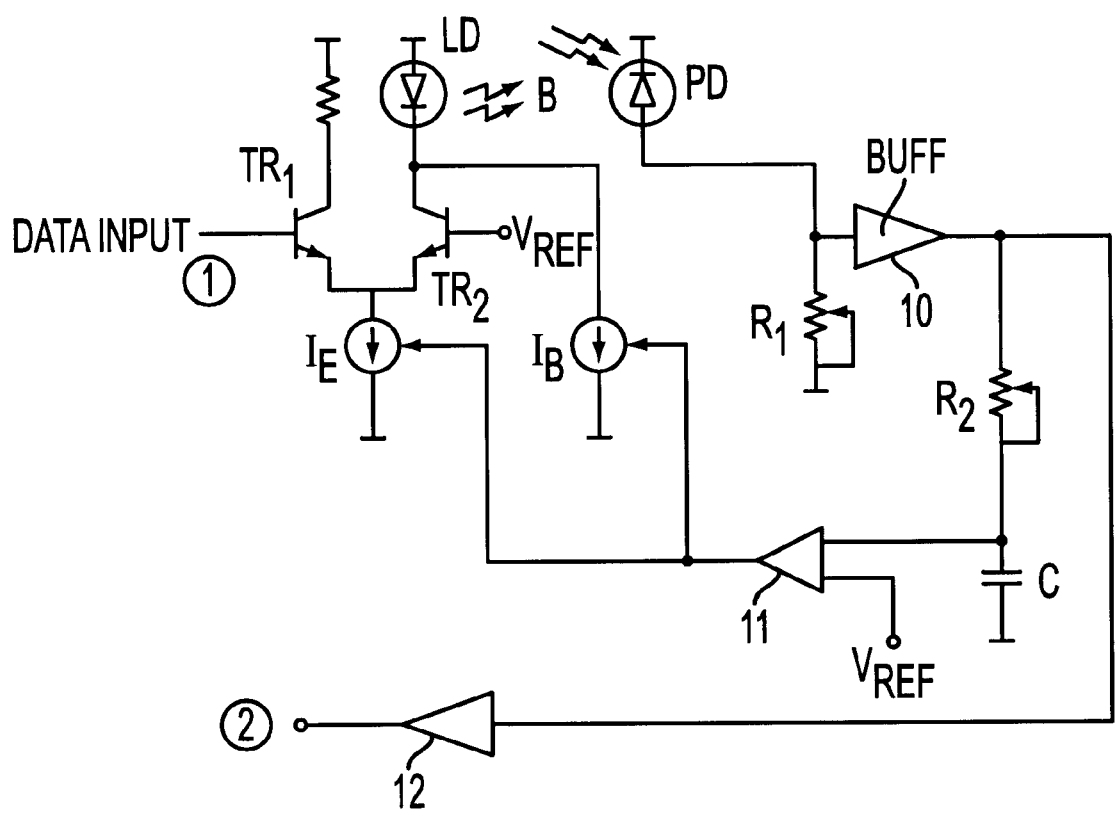
FIG. 3 shows a schematic circuit diagram of a structural example of pulse width modulation generator 1 illustrated in FIG. 1.

More specifically, the circuit corresponds to a laser diode driving circuit illustrated in FIG. 3 as an applied example of the present invention. The operation of the laser diode driving circuit will be now explained on reference to a waveform diagram shown in FIGS. 2A to 2J.

In FIG. 1, the refernce symbols ① (Specifically, ①a) as discussed below) and ② are respectively a data onput and an outpu of the pulse width modulation generator 1 (refer to FIGS. 2A, 2B, 2F, and 2G). A phase comparator 2 compares and detects a phase difference between the data input ① and the output ② of the pulse width modulation generator 1 (refer to FIGS. 2C, 2D, 2H, and 2I).

The phase comparator 2 outputs an upward area phase difference ③ and a downward area phase difference ④ between the data input ① and an output ② of the pulse width modulation generator 1. A direction of the pulse width variation can be obtained by comparing the phase differences ③ and ④ on the upward and downward areas.

That is, when the phase difference ③ on the upward area is larger than the phase difference ④ on the downward area, the pulse width is reduced. On the contrary, when the phase difference ③ on the upward area is smaller than the phase difference ④ on the downward area, the pulse width is enlarged. When the phase difference ③ on the upward area has the same size as that of the phase difference ④ on the downward area, it can be understood that the pulse width is not varied.

In the cases shown in FIGS. 2A to 2E, the output pulse width of the pulse width modulation generator 1 becomes large. On the contrary, in the cases shown in FIGS. 2F to 2J, there is no variation to the output pulse width of the pulse width modulation generator 1.

In FIG. 1, the phase differences ③ and ④ outputted from the phase comparator 2 are inputted to pulse width variable voltage generator 3. The pulse width variable voltage generator 3 includes a charging circuit which charges to a positive direction according to the output of the phase difference ③ and to a negative direction according to the output of the phase difference ④.

Then, the charged voltage output from the pulse width variable voltage generator 3 is led to pulse width variable section 4 as pulse width control signal ⑤.

In the example illustrated in FIGS. 2A to 2E, the direction is for enlarging the output pulse width. Then, a voltage charged to the negative direction is outputted as a control voltage in the direction for reducing the pulse width. On the other hand, in the example illustrated in FIGS. 2F to 2J, the output pulse width is stable. Therefore, a constant pulse width control signal ⑤ is outputted from the pulse width variable voltage generator 3.

The pulse width variable section 4 controls the pulse width modulation generator 1 according to the pulse width control signal ⑤ outputted from the pulse width variable voltage generator 3 to make the output pulse width constant.

Detailed circuits of respective portions shown in the first embodiment of FIG. 1 will be now explained.

In regard now to FIG. 3, a schematic circuit diagram of an embodiment of the pulse width modulation generator 1 is shown for use in a laser diode driving circuit. In FIG. 3, transistors $TR_1$ and $TR_2$ form a differential pair driving transistor circuit, which has a common emitter. The common emitter is connected to a current source $I_E$. When a pulse data input ① is inputted to a base of the transistor $TR_1$, a signal current corresponding to a difference between the input ① and a reference voltage $V_{REF}$ connected to a base of the other transistor $TR_2$ is piled on a bias current of the bias current source $I_B$ to flow to a laser diode LD. Thereby, a light-emitted output is generated from a laser diode LD.

A light-receipt element PD, such as a photo diode, receives a part of a light outputted from the laser diode LD, and converts it to a corresponding electric current. The converted current is flowing to a resistor $R_1$ and is converted to a voltage. The converted voltage passes through a buffer amplifier 10 and is waved-shaped by a slice amplifier 12, the output of which is inputted to the phase comparator 2 as a voltage ②.

The output of the buffer amplifier 10 is also averaged by an integral circuit formed of a resistor $R_2$ and a condenser C, and is inputted to one input terminal of a comparing amplifier 11. A comparing reference voltage $V_{REF}$ is inputted to the other input terminal of the comparing amplifier 11. The output of the comparing amplifier 11 is connected as a control to the current sources $I_E$ and $I_B$.

Therefore, paths of the photo diode PD, the comparing amplifier 11, the current sources $I_E$ and $I_B$ form an automatic power controller (APC) for the laser diode LD.

In the circuit shown in FIG. 3, pulse width of a light pulse emitted from the laser diode LD is varied according to a temperature, as described concerning to the conventional system.

In the present invention, pulse width variable section 4 controls the pulse width of the data input ① in the direction reversed to the pulse width variation of the pulse outputted from the pulse width modulation generator 1 on an input side of the generator 1 to suppress the pulse width variation.

Figure 4:
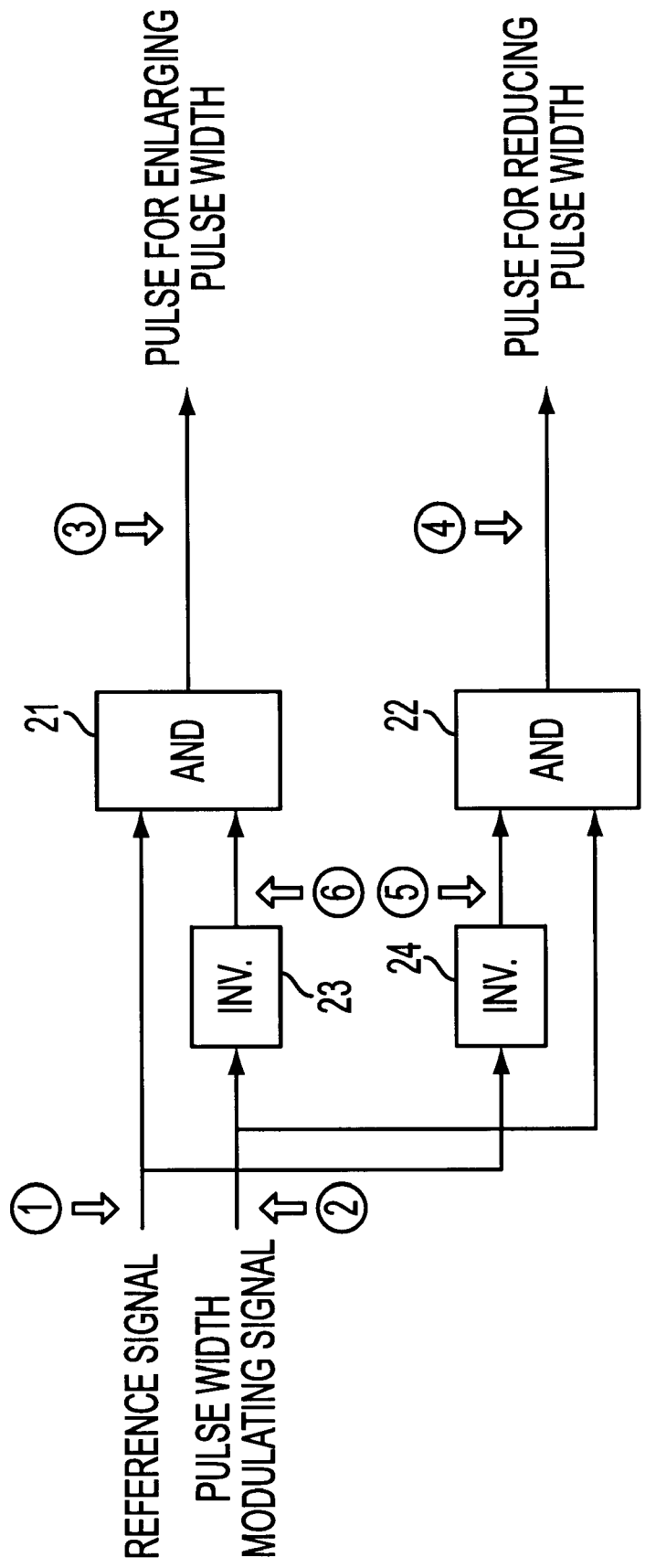
FIG. 4 is a block diagram of a structural example of a pulse comparator 2 illustrated in FIG. 1.
Figure 5:
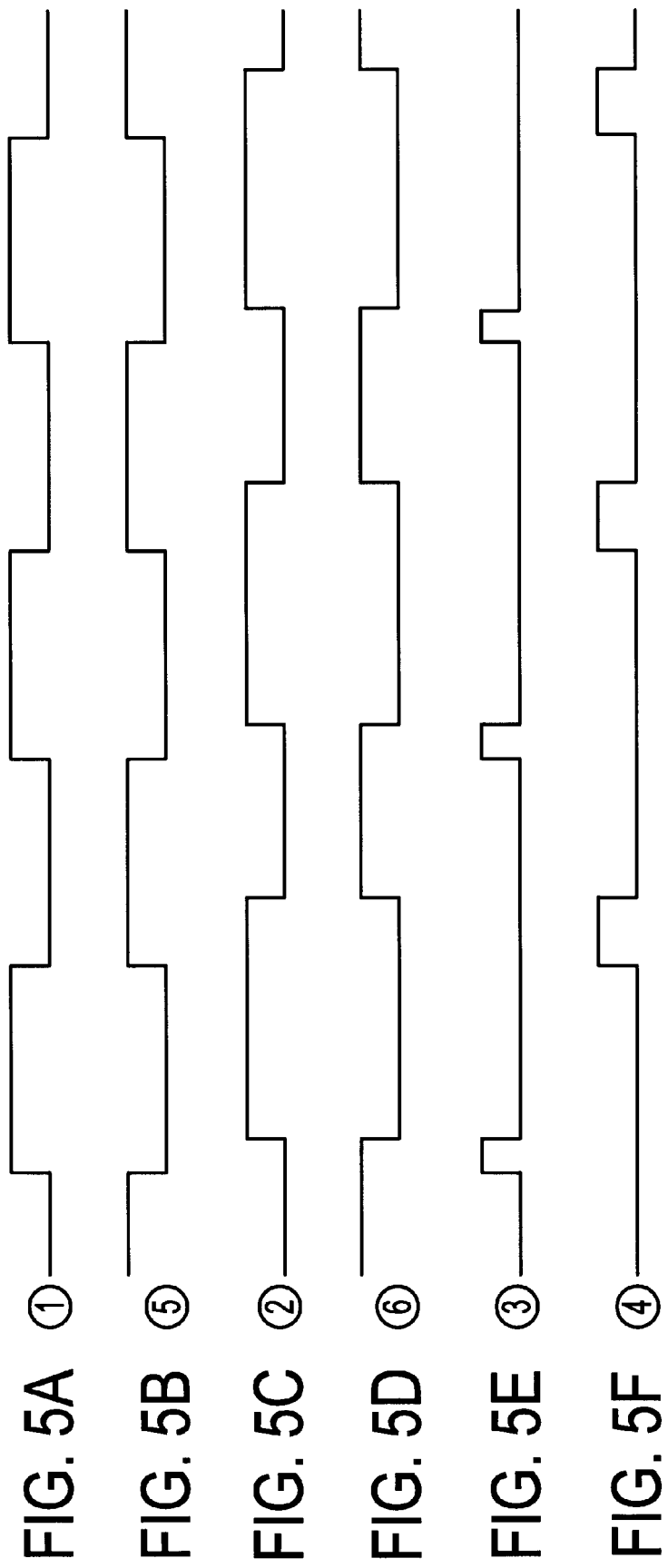
FIGS. 5A to 5F show operational timing charts of the pulse comparator 2 illustrated in FIG. 4.

FIG. 4 shows a structural example of the phase comparator 2 illustrated in FIG. 1. FIGS. 5A to 5F show waveform diagrams of the corresponding portions. The phase comparator 2 includes a pair of AND gates 21 and 22, and inverters 23 and 24 respectively connected to one input terminal of each of the AND gate circuits 21 and 22.

The data input ① is inputted to one input terminal of the AND gate circuit 21 as a reference signal. The output ② of the pulse width modulation generator 1 is inputted through an invertor 23 as pulse width variation signal and supplied to the other input terminal of the AND gate circuit 21 as signal ⑥.

As the result, an AND logic output ③ can be obtained from the AND gate circuit 21. Similarly, a signal ⑤ reversed to a reference signal ① and an AND logic output ④ of the output ② of the pulse width modulation generator 1 can be obtained from the AND gate 22.

As explained in FIG. 1, when the pulse width is enlarged, the AND logic output ③ is valid. On the contrary, when the pulse width is reduced, the AND logic output ④ is valid.

Figure 6:
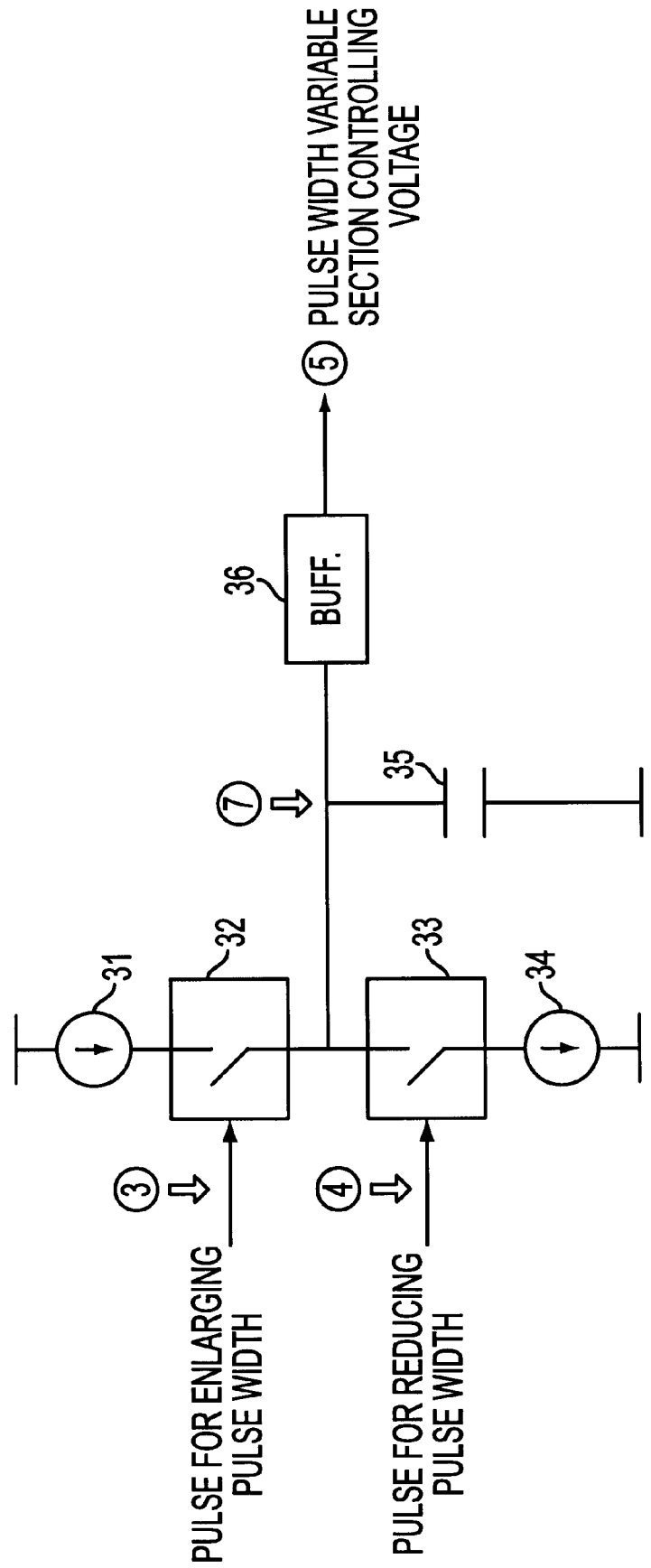
FIG. 6 is a block diagram of a structural example of pulse width variable voltage generator 3 illustrated in FIG. 1.

FIG. 6 shows a structural example of the pulse width variable voltage generator 3 illustrated in FIG. 1. In FIG. 6, the generator 3 includes current sources 31 and 34. Switches 32 and 33 are connected between the sources 31 and 34. A charging condenser 35 is connected to a common connecting point of the switches 32 and 33, and a voltage charged in the charging condenser 35 is outputted through a buffer amplifier 36.

The switches 32 and 33 are controlled according to the AND logic outputs ③ and ④ from the above-described phase comparator 2. That is, when it is required to enlarge pulse width, as the pulse width outputted from the pulse width modulation generator 1 is small, the AND logical output ③ is outputted ⑦ to close the switch 32. Thereby, a voltage toward the positive direction is charged in the charging condenser 35.

On the contrary, when the pulse width outputted from the pulse width modulation generator 1 is large, and it is required to reduce this pulse width the AND logic output ④ is outputted ⑦ to close the switch 33. Then, a voltage toward the negative direction is charged in the charging condenser 35 by the current source 34. Accordingly, the charged voltage in the charging condenser 35 is varied such as to be ⑦ shown in FIG. 7C corresponding to the AND logic outputs ③ and ④.

Figure 8A:
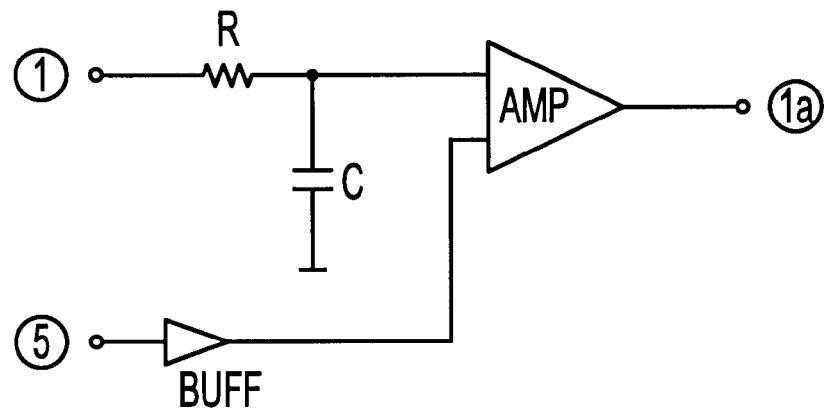
FIG. 8A shows a structural example of a pulse width variable section 4 illustrated in FIG. 1 and FIGS. 8B and 8c show the operational timing charts of the section 4.
Figure 8B:
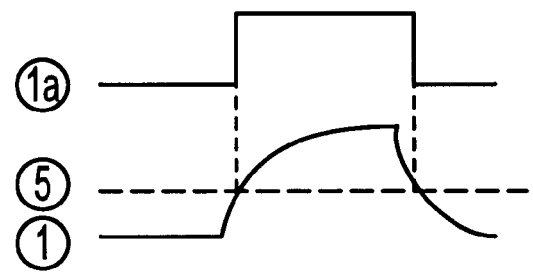
Figure 8C:
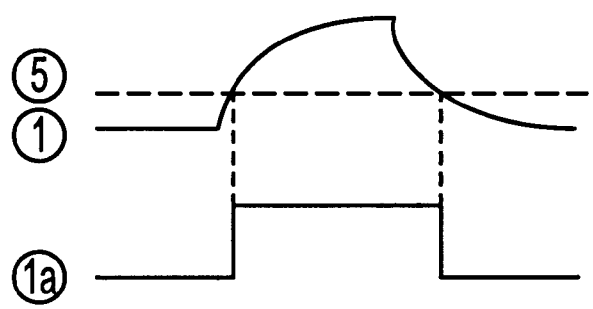

The charged voltage is outputted through the buffer amplifier 36 and is inputted to the pulse width variable section 4 illustrated in FIG. 1 as a control voltage ⑤ for controlling the pulse width variable section 4. In FIGS. 8A to 8C, one example of the pulse width variable section 4 will be explained.

As explained in FIG. 8A, in the pulse width variable section 4, a data input ① is inputted to one input terminal of a comparing amplifier through a RC integral circuit. Further, a voltage ⑤ for controlling the pulse width variable section is inputted through an invertor to the other input terminal of the comparing amplifier.

The comparing amplifier outputs a wave-shaped pulse when the data input ① is larger than the voltage ⑤ for controlling the pulse width variable section inputted via the invertor.

That is, as shown in FIG. 8B, as a level of the voltage ⑤ inputted through the invertor becomes large, the pulse width of the output ①a of the comparing amplifier becomes small. Since the voltage ⑤ controls to reduce the pulse width, it is controlled so as to reduce the pulse width of the data input ① in order to input to the pulse width modulation generator 1 in this way.

On the contrary, as shown in FIG. 8B, as the level of the voltage ⑤ for controlling the pulse width variable section inputted through the invertor becomes small, the pulse width of the output ①a of the comparing amplifier becomes large.

Figure 9:
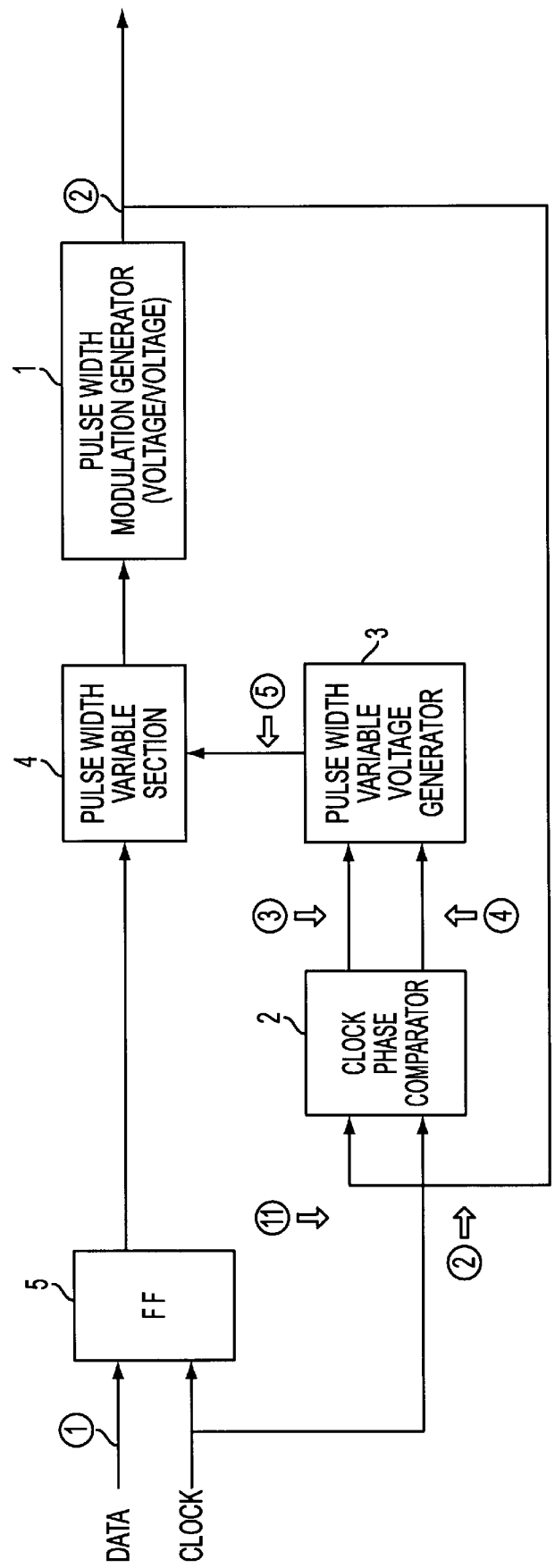
FIG. 9 is a block diagram of a second embodiment applied to pulse width control system according to the present invention.

FIG. 9 shows an modified example of the embodiment illustrated in FIG. 1. A data input ① is inputted by controlling its timing with a flip-flop 5. Therefore, a timing clock ⑪ for inputting data to the flip-flop 5 is equivalent to that of the data input ①.

Figure 10:
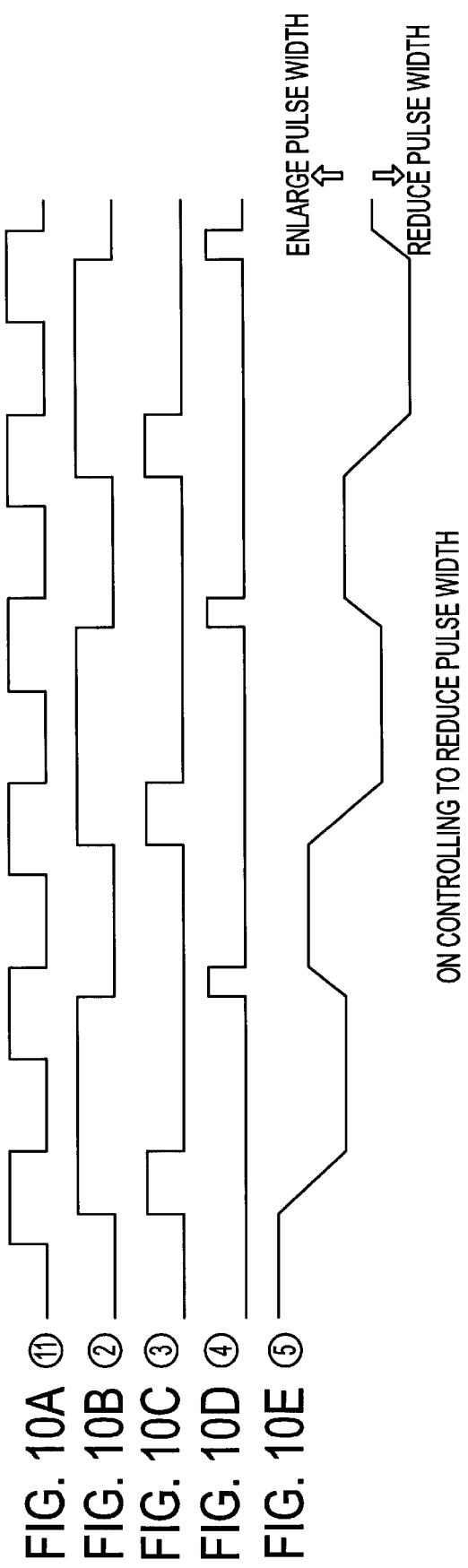
FIGS. 10A to 10E are operational timing charts of the second embodiment shown in FIG. 9.

From this point, as shown in operational timing charts illustrated in FIGS. 10A to 10B, the phase comparator 2 shown in FIG. 9 is formed so as to compare a phase of the output ② of the pulse width from the pulse width modulation generator 1 with that of a timing clock ① supplied to a flip flop 5.

FIGS. 10C, 10D, and 10E are similar to FIGS. 2C, 2D, and 2E, which are inputs and outputs of the pulse width variable voltage generator 3.

Figure 11:
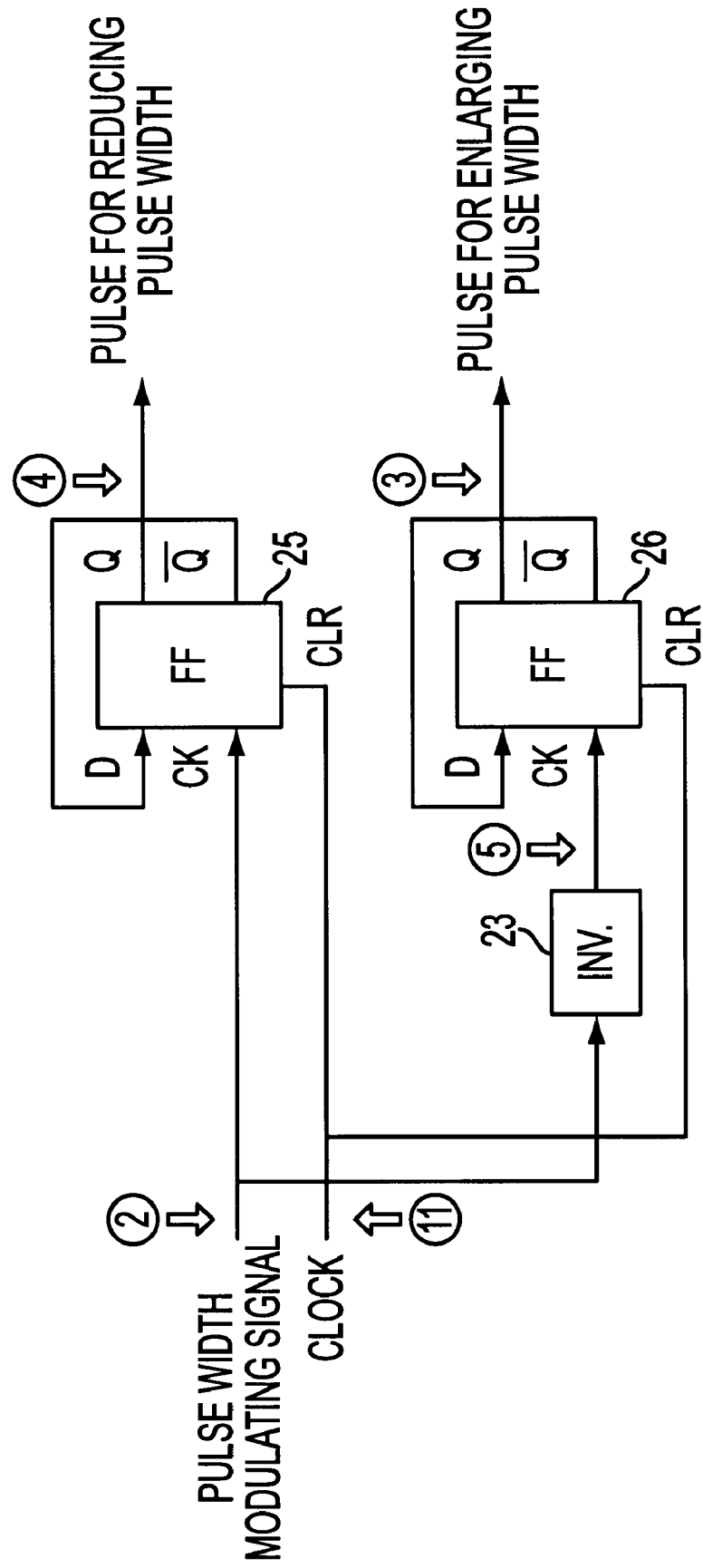
FIG. 11 is a block diagram of a structural example of a phase comparator 2 illustrated in FIG. 9.
Figure 12:
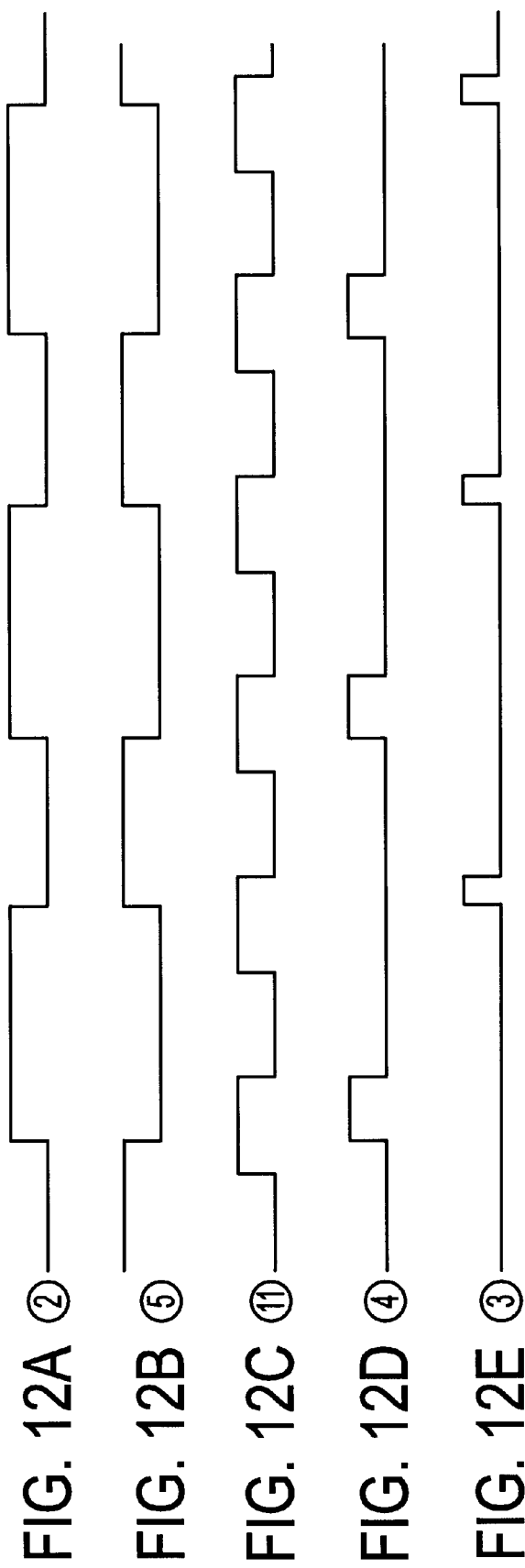
FIGS. 12A to 12E are operational timing charts of the phase comparator 2 illustrated in FIG. 11.

FIG. 11 shows another structural example of the phase comparator 2 illustrated in FIG. 4. The example is to cope with the case of comparing a phase of the timing clock ⑪ in FIG. 9. In comparison with a structure shown in FIG. 4, D-flip flops 25 and 26 are used instead of the AND gate circuits 21 and 22, and further, an invertor 23 is employed.

FIGS. 12A to 12E are operational timing charts of the embodiment illustrated in FIG. 11. As similarly with the explanation concerning FIGS. 4 and 5, a pulse ④ for reducing the pulse width and a pulse ③ for enlarging the pulse width are outputted from the D-flip flops 25 and 26.

Figure 13:
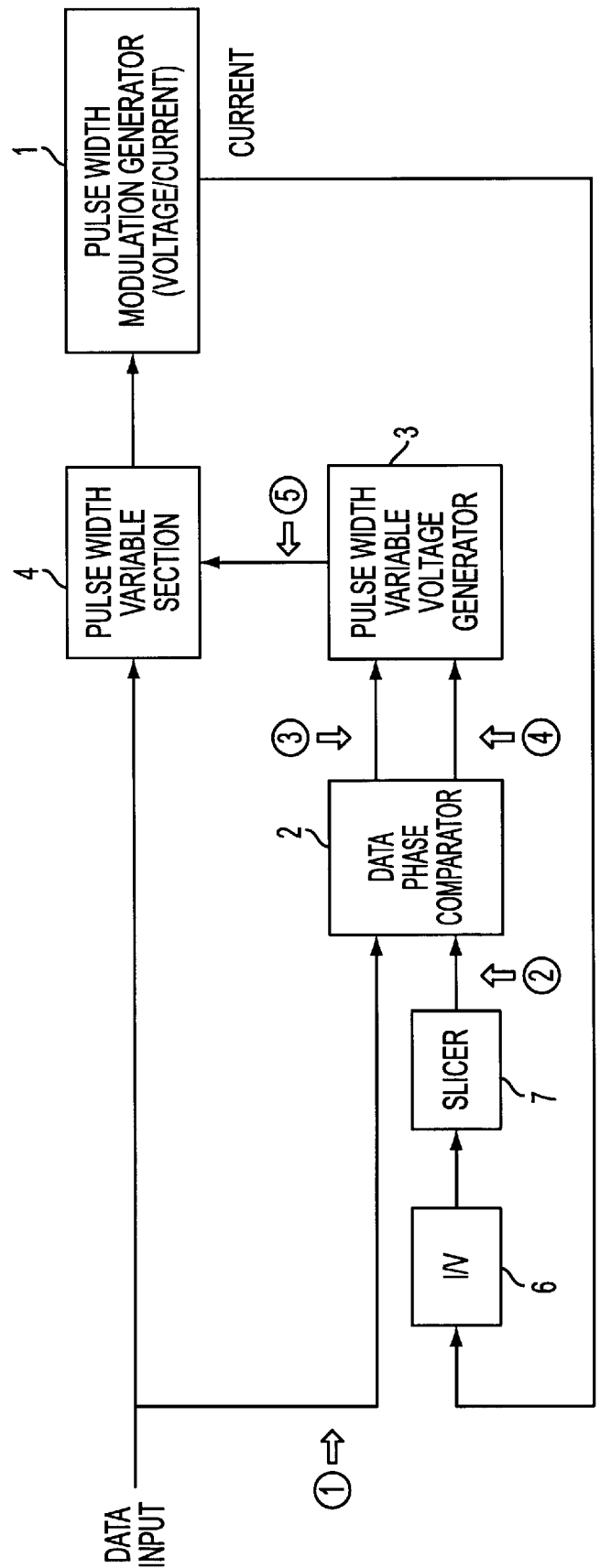
FIG. 13 is an block diagram of a third embodiment applied to a pulse width control system according to the present invention.

FIG. 13 is another embodiment of FIG. 1. The embodiment is to cope with the case where the pulse width modulation generator 1 makes a current to be an output. In comparison with the embodiment shown in FIG. 1, the circuit includes a current-voltage converter 6 for converting a current outputted from the pulse width modulation generator 1 to a voltage and a slicer 7 for shaping the converted voltage. The other components are the same as those of the structure illustrated in FIG. 1. Further, an operational timing chart of this structure shown in FIGS. 14A to 14E are similar to those when controlling to reduce the pulse width illustrated in FIGS. 2A to 2E.

On assumption that the laser diode driving circuit shown in FIG. 3 is used as one component when the pulse width modulation generator 1 makes a current to be an output, a current is outputted by obtaining an output from the input side of the buffer amplifier 10 in FIG. 3. In FIG. 13, the current-voltage converter 6 can be formed as equivalent to the variable resistor $R_1$ shown in FIG. 3.

Figure 15:
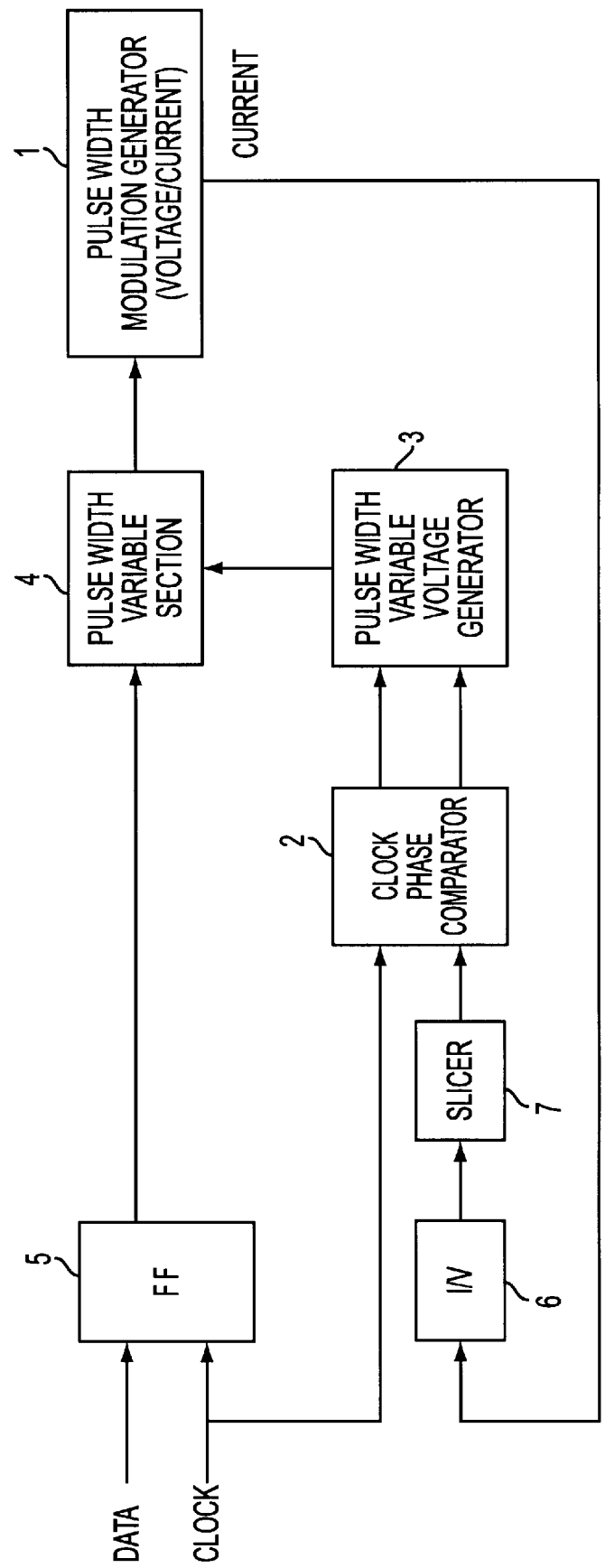
FIG. 15 is a block diagram of a fourth embodiment applied to a pulse width control system according to the present invention.

FIG. 15 shows an example for replacing the data input inputted to the phase comparator 2 in the embodiment shown in FIG. 13 to a timing of a clock ⑪ supplied to the flip flop 5 as explained in the embodiment of FIG. 9. Therefore, the operational timing charts in this case are similar as those shown in FIGS. 10A to 10E.

Figure 16:
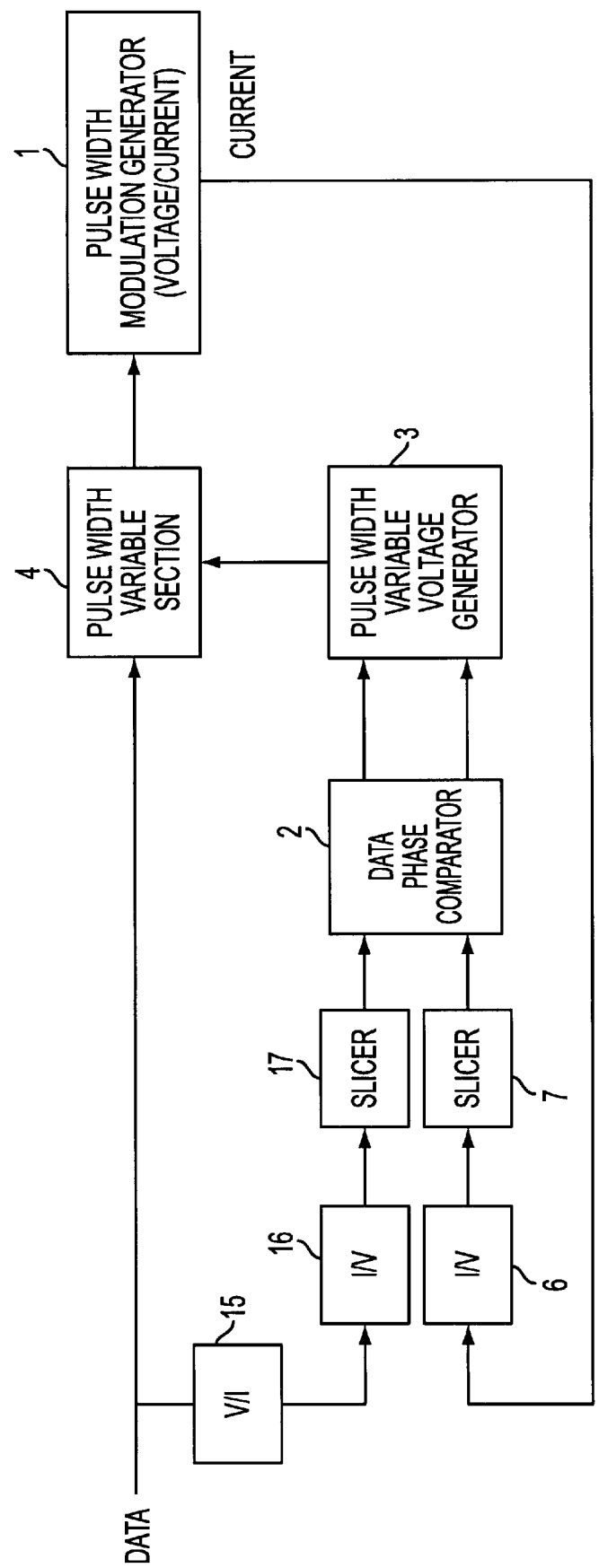
FIG. 16 is a block diagram of a fifth embodiment applied to a pulse width control system according to the present invention.

FIG. 16 is an embodiment in which a current-voltage converter 16 and a slicer 17 for shaping the converted voltage are provided on the data input side in consideration of a balance of the circuit of the embodiment shown in FIG. 13. Accordingly, the circuit shown in FIG. 16 includes a voltage-current converter 15 for converting a data input to a voltage or a current.

The operational timing charts of the embodiment shown in FIG. 16 are similar as those-shown in FIGS. 14A to 14E corresponding to the embodiment shown in FIG. 13.

Figure 17:
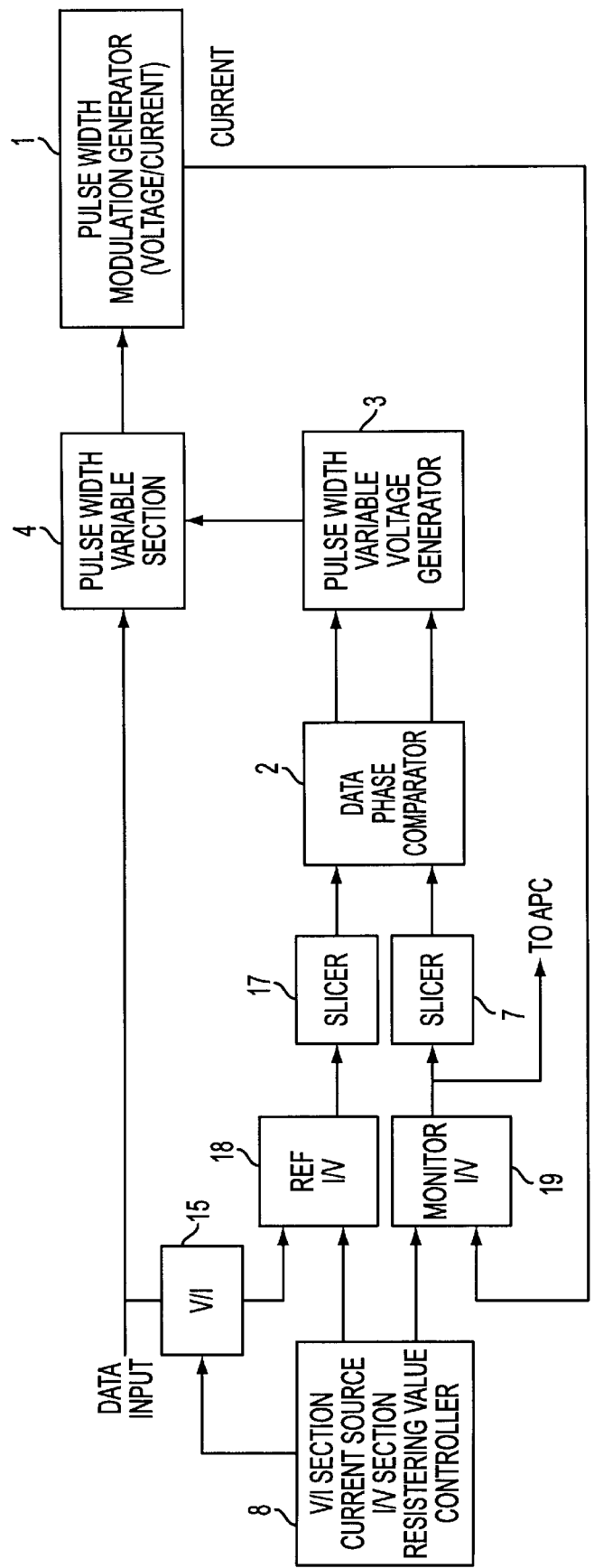
FIG. 17 is a block diagram of a sixth embodiment applied to a pulse width control system according to the present invention.

FIG. 17 shows a modified example of the embodiment shown in FIG. 16. In FIG. 16, it is assumed that pulse width variation be generated between a monitoring group, i.e., a current-voltage converter 6 and a slicer 7 for shaping the converted voltage, and a reference group, i.e., a current-voltage converter 16 provided for the data input and a slicer 17 for shaping the converted voltage. FIG. 17 shows an embodiment to solve this pulse width variation.

In FIG. 17, a circuit includes a current-voltage converting resistor 18, acting as a current-voltage converter, for converting the output of the circuit 15 converting a voltage of data input to a current, instead of the current-voltage converter 16 shown in FIG. 16. The circuit further includes a current-voltage converting resistor 19 acting as a current-voltage converter for converting the current output from the pulse width modulation generator 1 to a voltage, instead of the current-voltage converter 6 shown in FIG. 16.

The output of the current-voltage converting resistor 19 is inputted to a comparing amplifier 11 forming an automatic power controller (APC).

A controller 8 is further provided to control a current value outputted from the voltage-current converter 15 to be equivalent to that inputted from the current-voltage converting resistor 19 for monitoring. Simultaneously, it is possible to suppress pulse width variation for referencing and monitoring by controlling a trans-impedance of the current-voltage converting resistor 18 to be equivalent to that of the current-voltage converting resistor 19.

Both of the resistors 18 and 19 can be formed with the variable resistor $R_1$ shown in FIG. 3. Therefore, the trans-impedance of the current-voltage converting resistor 18 and the current-voltage converting resistor 19 can be the same by controlling the variable resistor.

Figure 14:
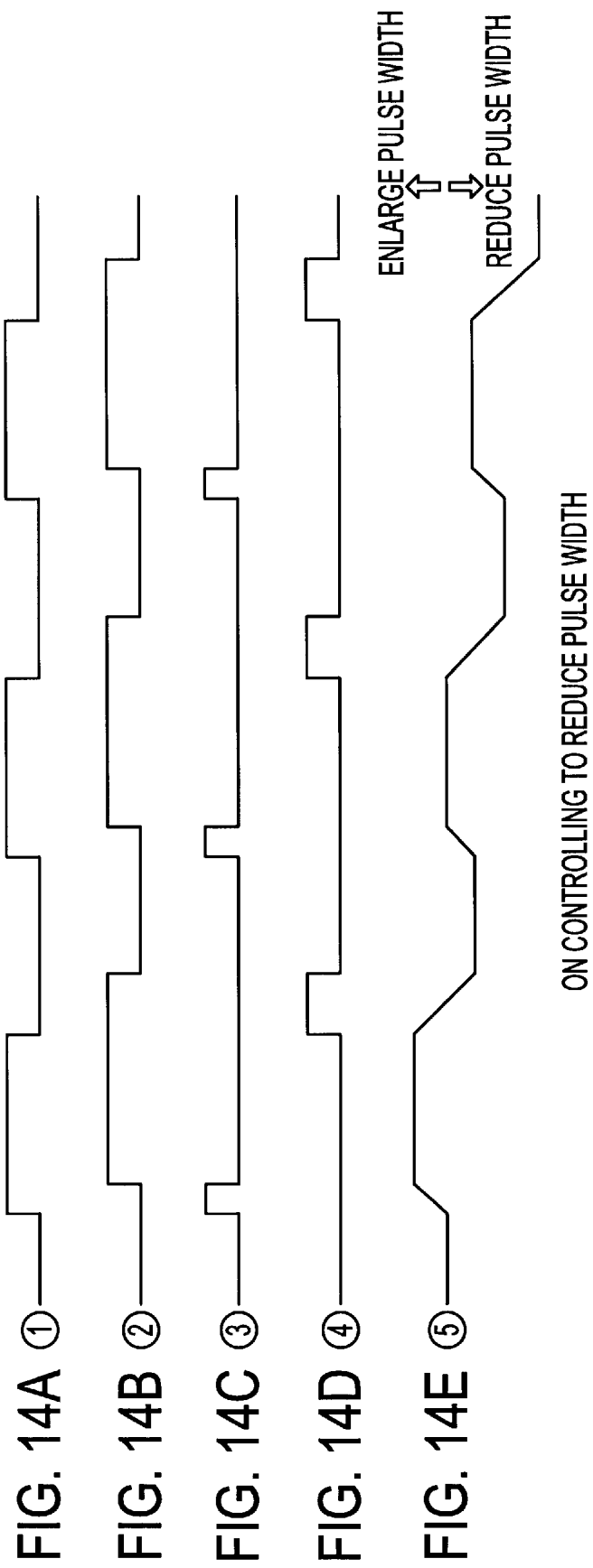
FIGS. 14A to 14E are operational timing charts of the third embodiment illustrated in FIG. 13.

As an operational waveform diagram is similar as that shown in FIG. 14 in this case, the explanation will be omitted here.

Figure 18:
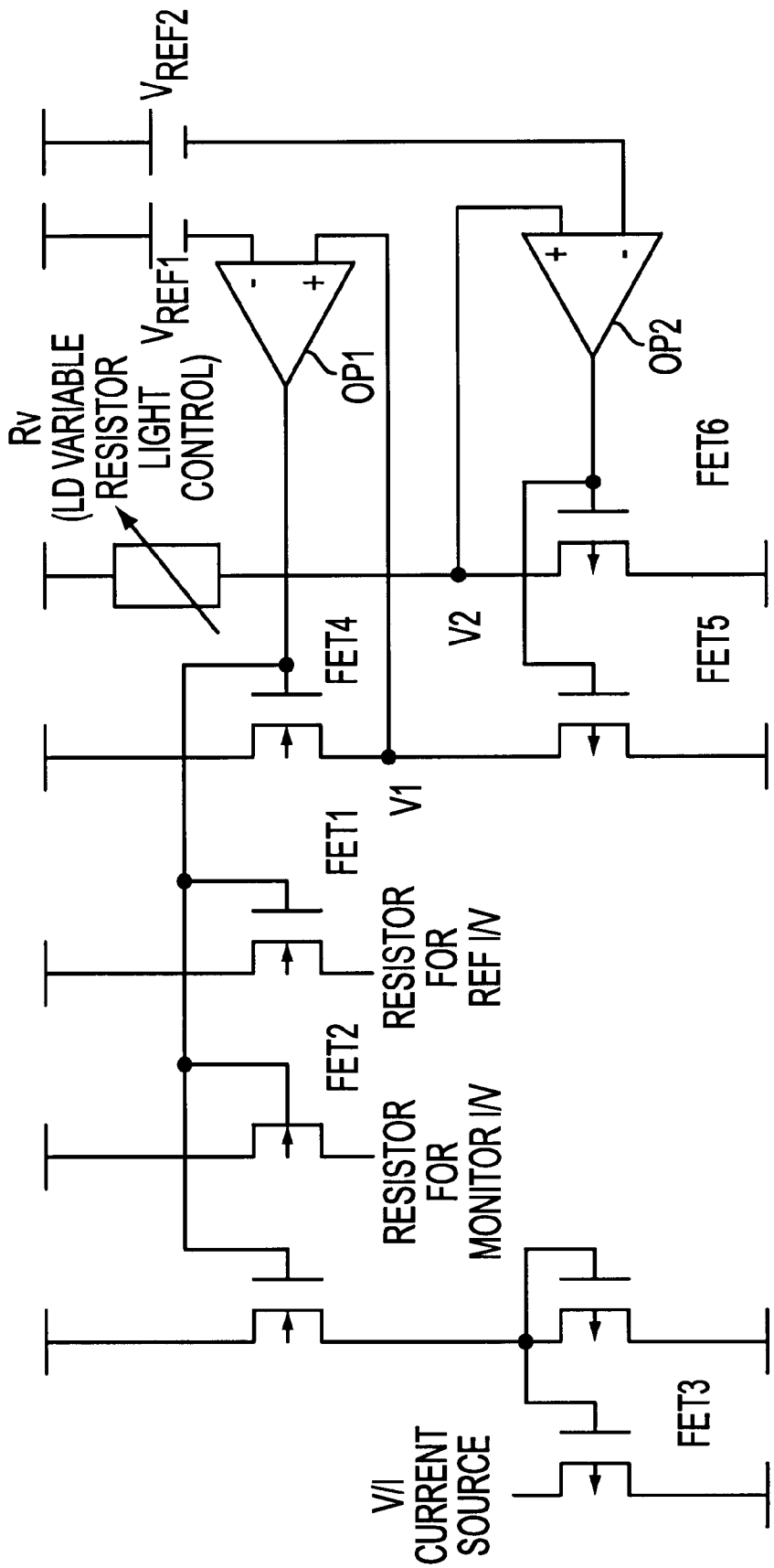
FIG. 18 shows a structural example of a controller 8 on the sixth embodiment shown in FIG. 17.

FIG. 18 is a schematic circuit diagram of an embodiment of the controller 8 shown in FIG. 17. In FIG. 18, FET1, FET2 and FET3 output control signals for controlling the current source of the voltage-current. converter 15, a variable resistance value of the current-voltage converting resistor 18, and a variable resistance value of the current-voltage converting resistor 19, respectively, shown in FIG. 17.

Further, the circuit includes a FET4 and a FET5 connected in series and a variable resistor $R_V$ and a FET6 connected in series. An operational amplifier OP1 controls a gate voltage of the FET4 so as to adjust a potential $V_1$ of a connecting point between the FET4 and the FET5 to the reference voltage $V_{REF}$.

Simultaneously, an operational amplifier OP2 controls a gate voltage of the FET6 so as to adjust a potential $V_2$ of a connecting point between the variable resistor $R_V$ and the FET6 to a reference voltage $V_{REF}$. Further, the operational amplifier OP2 controls a gate voltage of the FET5 so as to be reflected according to a control value of the variable resistor $R_V$.

When the value of the variable resistor $R_V$ is changed, so does the output of the operational amplifier OP1. Thereby, the trans-conductances of the FET1 and the FET2 are changed. Then, each of the trans-impedance of the resistors 18 and 19 may be commonly controlled.

Concurrently, a trans-impedance of the voltage-current converting resistor 15 is controlled by the change of the trans-conductance of the FET3 corresponding to a control of the impedance of the resistors 18 and 19.

Figure 19:
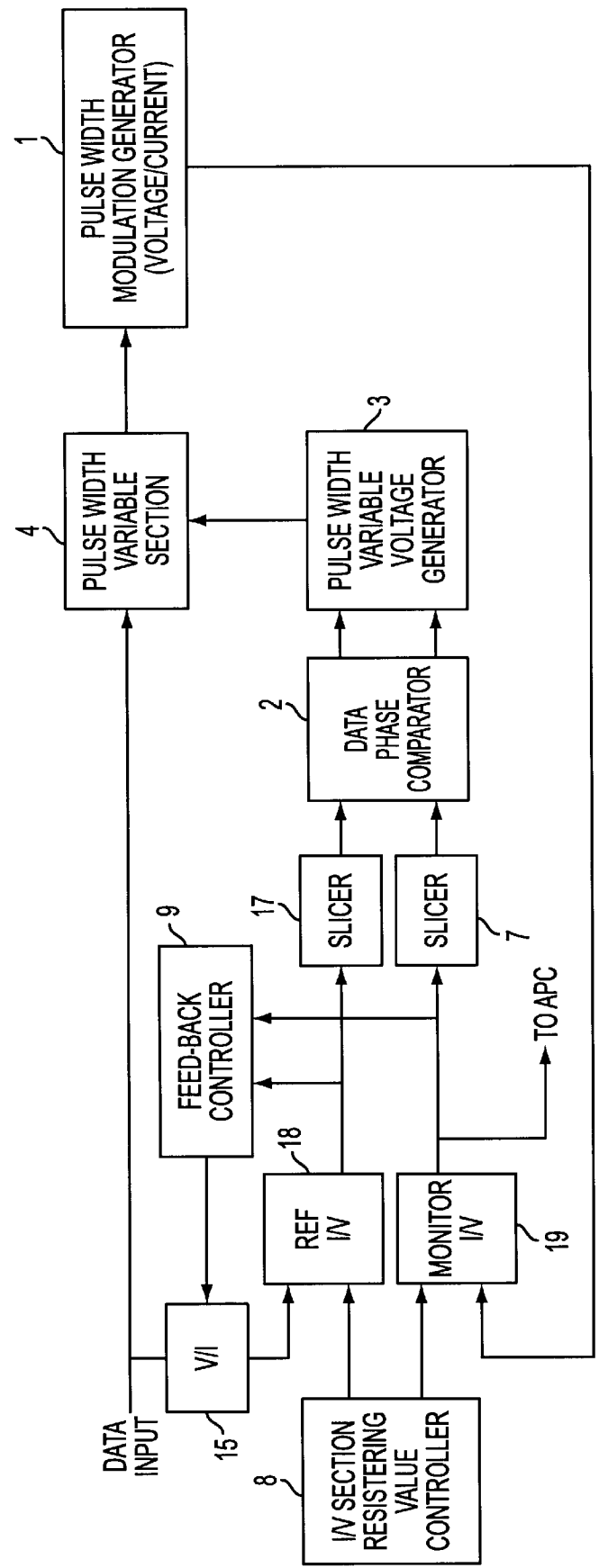
FIG. 19 is a block diagram of a seventh embodiment applied to a pulse width control system according to the present invention.

FIG. 19 shows an advanced example of the embodiment shown in FIG. 17. In FIG. 19, a feed back controller 9 automatically controls a current amplitude outputted from the voltage-current converter 15, which converts the data input to a current to be a constant level, according to the output of the resistors 18 and 19 in FIG. 17.

Thereby, it becomes possible to stably suppress the pulse width variations for referencing and monitoring. The operational timing chart in this case is similar as that shown in FIG. 14, and therefore, are not shown in the diagram.

Figure 20:
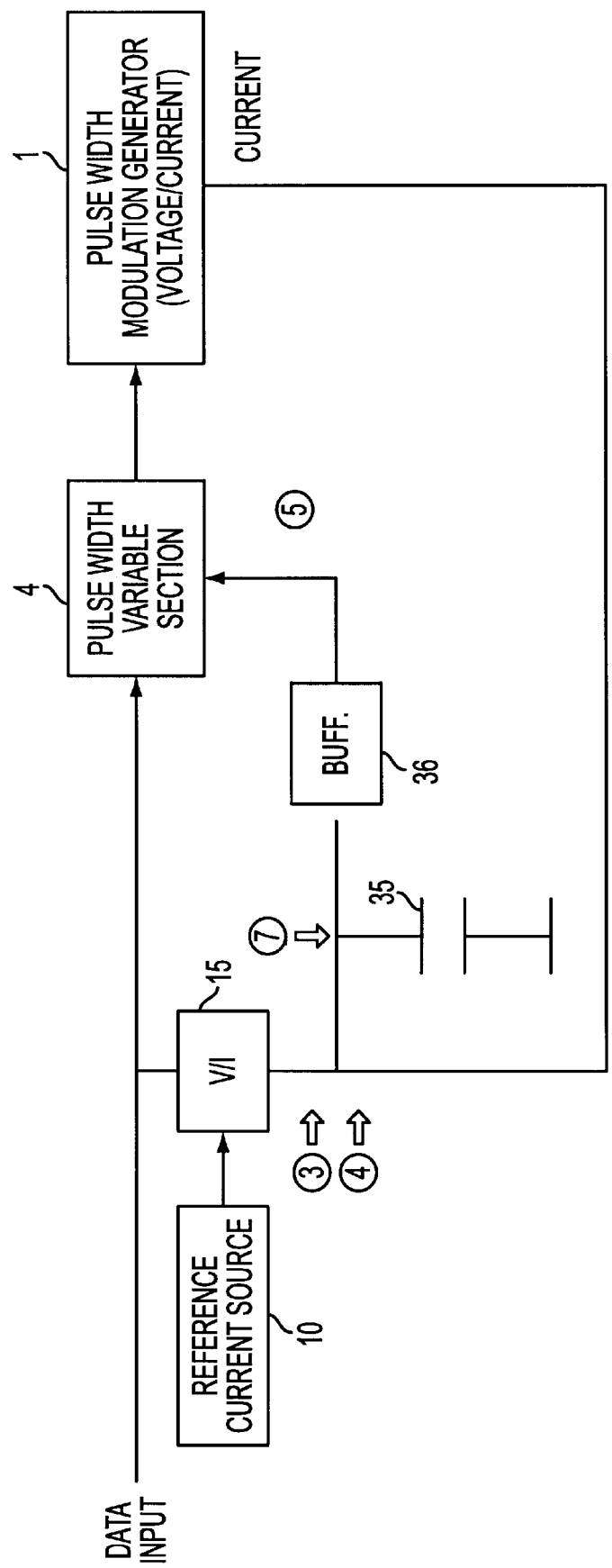
FIG. 20 is a block diagram of an eighth embodiment applied to a pulse width control system according to the present invention.
Figure 21:
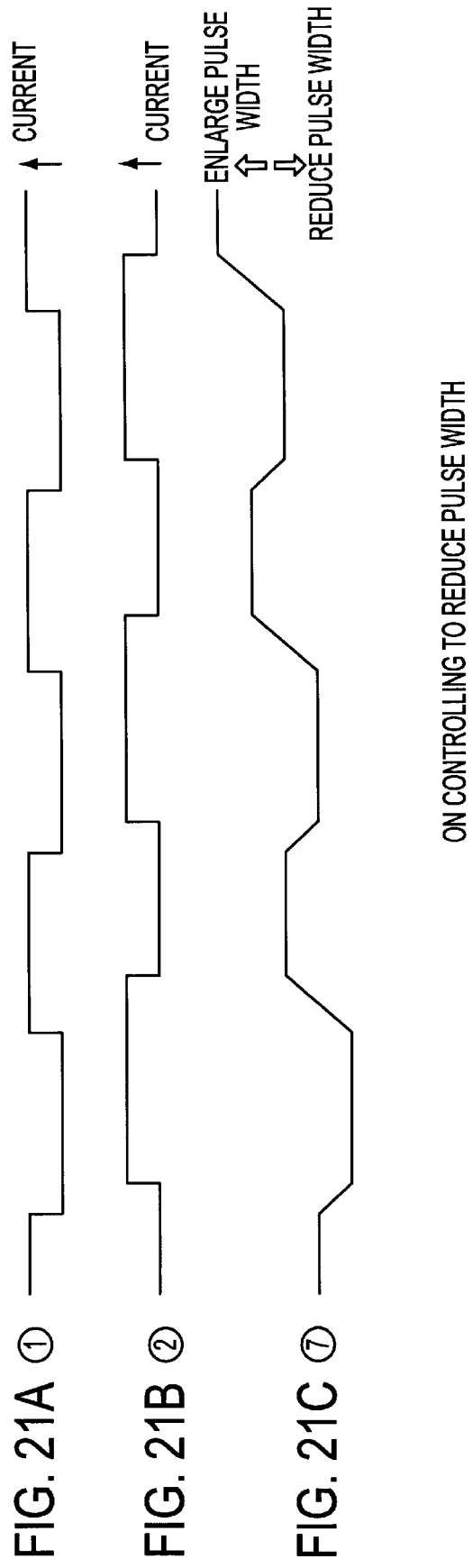
FIGS. 21A to 21C show operational timing charts on the eighth embodiment illustrated in FIG. 20.
Figure 22:
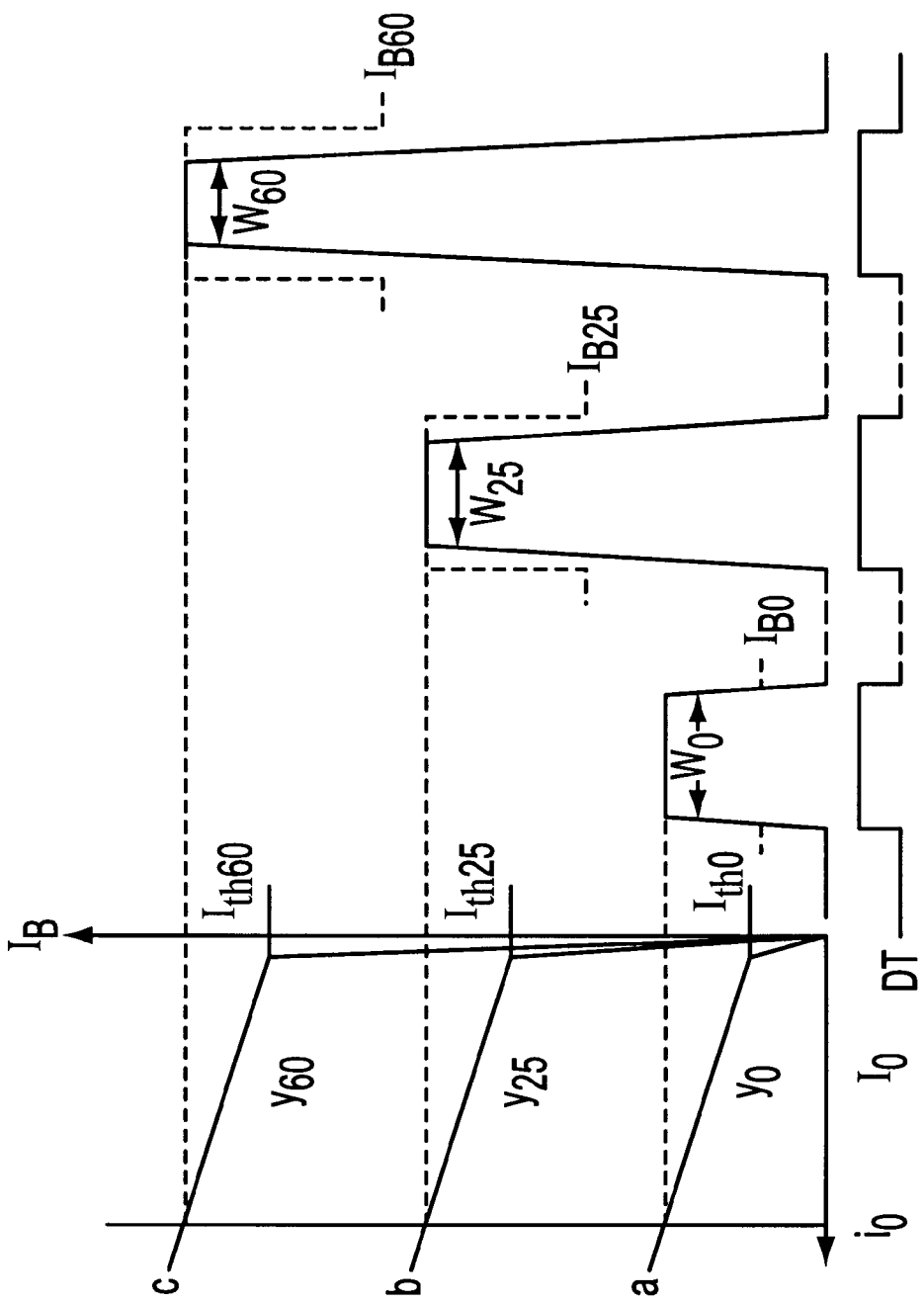
FIG. 22 illustrates a current characteristic of a laser diode.
Figure 23:
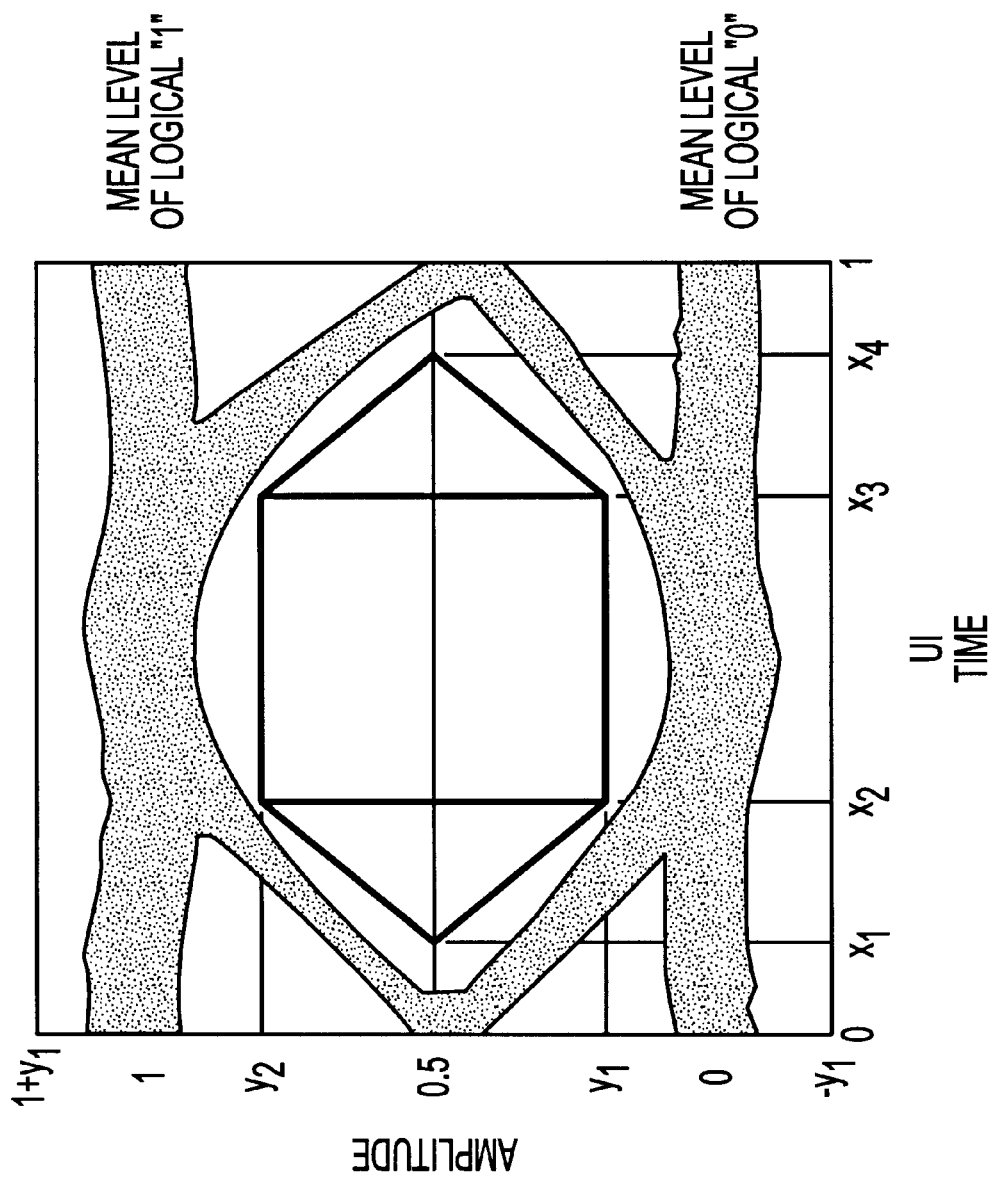
FIG. 23 shows an eye pattern mask prescribed in ITU-Recommendation G.662.
Figure 24A:
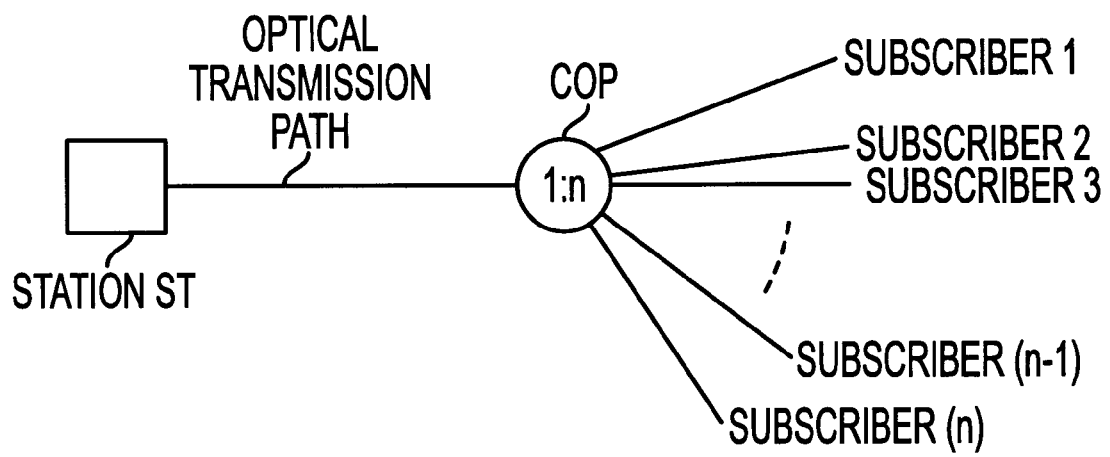
FIGS. 24A and 24B are explanatory diagrams of a system for sending and receiving burst signals through an optical transmission path between a central office and a plurality of subscribers.
Figure 24B:
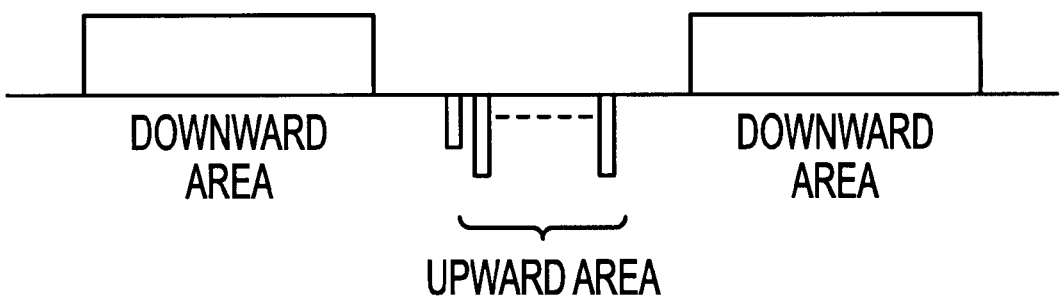

FIG. 20 is a still other embodiment of the present invention. FIGS. 21A to 21C show the operational timing charts. The circuit is formed so that an output current ③ is converted to a current from a data input by the voltage-current converter 15, connected to the reference current source 10 and an output current ④ from the pulse width modulation generator 1 to charge the composed current to a charging condenser 35.

Then, the charged voltage ⑦ is inputted to the pulse width variable section 4 through a buffer amplifier 36 as pulse width control voltage ⑤. In the embodiment shown in FIG. 20, it is advantageous to simplify a structure of the pulse width variable voltage generator 3 without the switches 32 and 33, and current sources 31 and 34.

As explained in accompanying with the embodiments, according to the present invention, it becomes possible to realize pulse width control system in which there is no need to control by individual variable resistor for pulse width variation generated at the beginning of a pulse or pulse width variation caused by a variation in temperature, current or voltage, and pulse width can be controlled at a high speed even if a mark to a space ratio is varied.

This invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of the equivalency of the claims are therefore intended to be embraced therein.

What is claimed is:

1. An output pulse width control system comprising:
   a first circuit outputting a pulse output signal corresponding to an input pulse;
   a second circuit outputting a phase difference between an input data pulse and the pulse output signal; and
   a third circuit receiving the input data pulse and outputting the input pulse to the first circuit based on the input data pulse, wherein a pulse width of the input pulse varies based on the phase difference so as to reduce the phase difference.

2. The output pulse width control system according to claim 1, further comprising:

a fourth circuit synchronizing the input data pulse to a clock, wherein said second circuit receives the clock instead of the input data pulse and wherein the phase difference outputted by the second circuit is between the clock and the pulse output signal, and the third circuit receives the synchronized input data pulse instead of the input data pulse.

3. The output pulse width control system according to claim 1, wherein the first circuit comprises:

a laser diode outputting an optical signal corresponding to the input pulse;

a light receipt element receiving a part of the optical signal outputted from said laser diode and outputting a current corresponding to the optical signal;

a current-voltage converter converting the current from said light receipt element to a voltage signal; and an outputting portion to output the voltage signal as the pulse output signal.

4. The output pulse width control system according to claim 3, wherein the outputting portion comprises:

a first slicer to shape the voltage signal outputted from the current-voltage converter.

5. The output pulse width control system according to claim 1, wherein said first circuit includes a laser diode outputting an optical signal corresponding to the input pulse, a light receipt element receiving the optical signal outputted from said laser diode, and a section of an outputting portion to output a current corresponding to the received optical signal, wherein the outputting portion further includes a first current-voltage converter converting said current to a voltage signal, and a first slicer to shape the voltage signal outputted from said first current-voltage converter as the pulse output signal.

6. The output pulse width control system according to claim 5, further comprising:

a voltage-current converter converting said input data pulse to a current;

a second current-voltage converter converting the current outputted from said voltage-current converter to a voltage; and a second slicer converting the voltage output from said second current-voltage converter to a second digital signal, wherein the second circuit receives the pulse output signal as a first digital signal and the second digital signal instead of the input data pulse and provides a phase difference between the first digital signal and the second digital signal instead of the phase difference between the input data pulse and the pulse output signal.

7. The output pulse width control system according to claim 6, further comprising:

a controller controlling a current value outputted from the voltage-current converter to be equivalent to that of the current inputted to the second current-voltage converter and controlling a transimpedance of the second current-voltage converter to be equivalent to that of the first current-voltage converter.

8. The output pulse width control system according to claim 1, wherein said third circuit includes a charging circuit charging toward a positive or negative direction according to the phase difference detected by the second circuit.

9. The output pulse width control system according to claim 6, further comprising:

an automatic power controller to control said voltage-current converter such that an output amplitude of the first current voltage converter be equivalent to that of the second current-voltage converter.

10. An output pulse width control system comprising:

a first circuit outputting a pulse output signal corresponding to an input pulse;

a second circuit receiving an input data pulse and the pulse output signal and detecting an upward area phase difference and a downward area phase difference between the input data pulse and the pulse output signal; and a third circuit receiving the input data pulse and outputting the input pulse to the first circuit based on the input data pulse wherein a pulse width of the input pulse varies based on the detected upward and downward phase differences so as to make the upward area phase difference equal to the downward area phase difference.

11. The output pulse width control system according to claim 10, further comprising:

a fourth circuit synchronizing the input data pulse to a clock such that said third circuit receives the synchronized input data pulse instead of the input data pulse and outputs the input pulse to the first circuit based on the synchronized input data pulse, wherein said second circuit receives the clock instead of the input data pulse and detects an upward area phase difference and a downward area phase difference between the clock and the pulse output signal, instead of the phase difference between the input data pulse and the pulse output signal.

* * * * *